United States Patent
Mine et al.

(10) Patent No.: US 6,833,582 B2
(45) Date of Patent: Dec. 21, 2004

(54) NONVOLATILE SEMICONDUCTOR MEMORY DEVICE

(75) Inventors: Toshiyuki Mine, Fussa (JP); Takashi Hashimoto, Iruma (JP); Senichi Nishibe, Hitachinaka (JP); Nozomu Matsuzaki, Kokubunji (JP); Hitoshi Kume, Musashino (JP); Jiro Yugami, Yokohama (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/766,188

(22) Filed: Jan. 29, 2004

(65) Prior Publication Data

US 2004/0183122 A1 Sep. 23, 2004

(30) Foreign Application Priority Data

Jan. 31, 2003 (JP) ...................................... P2003-023690

(51) Int. Cl.[7] ........................ H01L 29/792; H01L 29/76; H01L 29/94; H01L 31/062; H01L 31/113

(52) U.S. Cl. ........................ 257/326; 257/325; 257/366; 257/411

(58) Field of Search ................................ 257/324, 325, 257/326, 365, 366, 410, 411

(56) References Cited

U.S. PATENT DOCUMENTS

| | | | | |
|---|---|---|---|---|
| 5,969,383 | A | * | 10/1999 | Chang et al. |
| 6,229,176 | B1 | * | 5/2001 | Hsieh et al. ................. 257/316 |
| 6,255,166 | B1 | * | 7/2001 | Ogura et al. |
| 6,388,293 | B1 | * | 5/2002 | Ogura et al. |
| 2003/0160280 | A1 | * | 8/2003 | Yoshino ..................... 257/324 |

* cited by examiner

Primary Examiner—Ngân V. Ngô
(74) Attorney, Agent, or Firm—Reed Smith LLP; Stanley P. Fisher, Esq.; Juan Carlos A. Marquez, Esq.

(57) ABSTRACT

A nonvolatile semiconductor memory device configured by a select MOS transistor provided with a gate insulator film and a select gate electrode, as well as a memory MOS transistor provided with a capacitor insulator film comprising a lower potential barrier film, a charge trapping film, and an upper potential barrier film, as well as a memory gate electrode. The charge trapping film is formed with a silicon oxynitride film and the upper potential barrier film is omitted or its thickness is limited to 1 nm and under to prevent the Gm degradation to be caused by the silicon oxynitride film, thereby lowering the erasure gate voltage. The charge trapping film is formed with a silicon oxynitride film used as a main charge trapping film and a silicon nitride film formed on or beneath the silicon oxynitride film so as to form a potential barrier effective only for holes. And, a hot-hole erasing method is employed to lower the erasure voltage.

20 Claims, 8 Drawing Sheets

|  | Vsg | Vmg | Vs | Vd | Vwell | METHOD (TECHNIQUE) |
|---|---|---|---|---|---|---|
| WRITE (INJECTION) | ~Vt | 10V | 5V | 0V | 0V | SOURCE SIDE INJECTION |
| ERASE (DISCHARGE) | 0V | VARIABLE | 0V | 0V | 0V | TUNNELING |
| READ | 1.8V | 0V | 0V | 1.8V | 0V | REVERSE READ |
|  | 1.8V | 0V | 1.8V | 0V | 0V | FORWARD READ |

|  | Vsg | Vmg | Vs | Vd | Vwell | METHOD (TECHNIQUE) |
|---|---|---|---|---|---|---|
| WRITE (INJECTION) | ~Vt | 10V | 5V | 0V | 0V | SOURCE SIDE INJECTION |
| ERASE (DISCHARGE) | 0V | −6V | 0V | 5~7V | 0V | (HOT HOLE INJECTION) |
| READ | 1.8V | 0V | 0V | 1.8V | 0V | REVERSE READ |
|  | 1.8V | 0V | 1.8V | 0V | 0V | FORWARD READ |

PRIOR ART

| | STACK FILMS STRUCTURE | | MAIN TRAPPING FILM | POTENTIAL BARRIER FILM | OXYGEN CONCENTRATION OF SiON FILM |
|---|---|---|---|---|---|
| 1 | SiO2/SiON | | SiON | NONE | |
| 2 | SiO2/SiON/SiO2 | | SiON | SiO2 | |
| 3 | SiO2/SiON/SiN | | SiON | NONE | |
| 4 | SiO2/SiN/SiON | | SiON | NONE | |
| 5 | SiO2/SiON(1)/SiON(2) | (a) | SiON(1) | NONE | SiON(1)>SiON(2) |
| | | (b) | SiON(2) | NONE | |
| 6 | SiO2/SiN(1)/SiON/SiN(2) | | SiON | NONE | |
| 7 | SiO2/SiON(1)/SiN/SiON(2) | (a) | SiON(1) | NONE | SiON(1)>SiON(2) |
| | | (b) | SiON(2) | NONE | |

NONVOLATILE SEMICONDUCTOR MEMORY DEVICE

PRIORITY CLAIM

This application claims priority under 35 U.S.C. §119 to Japanese patent application P2003-023690 filed Jan. 31, 2003, the entire disclosure of which is hereby incorporated herein by reference.

FIELD OF THE INVENTION

The present invention relates to a nonvolatile semiconductor memory device and more particularly to a highly reliable nonvolatile semiconductor memory device that enables low voltage fast programming.

BACKGROUND OF THE INVENTION

MNOS (Metal-Nitride-Oxide-Semiconductor) memories and MONOS (Metal-Oxide-Nitride-Oxide-Semiconductor) memories are typical examples of nonvolatile memories (nonvolatile semiconductor memory devices) having storage nodes formed with insulator films. An MNOS memory is structured as a laminated layer comprising a conductive gate electrode layer (M), a silicon nitride film (N), a silicon oxide film (O), and a semiconductor substrate (S). An MNOS memory is structured as a laminated layer comprising a conductive gate electrode layer (M), a silicon oxide film (O), a silicon nitride film (N), a silicon oxide film (O) and a semiconductor substrate (S). In each of those MNOS and MONOS memories, carrier electrons are injected/ejected in/from a silicon nitride film provided with a charge trapping function to store/erase information therein/therefrom.

The structures of the above-described nonvolatile memories and the programming methods for them are disclosed in the patent document 1 (the official gazette of JP-A No. 102466/2001 (corresponding to U.S. Pat. No. 6,255,166)), the patent document 2 (the official gazette of JP-A No. 148434/2001 (corresponding to U.S. Pat. No. 6,388,293)), and the patent document 3 (corresponding to the official gazette of U.S. Pat. No. 5,969,383)

Hereunder, a brief description will be made for both structure and operation of a memory cell of the type disclosed in the patent document 1 (the official gazette of JP-A No. 102466/2001 (corresponding U.S. Pat. No. 6,255,166) and the patent document 2 (the official gazette of JP-A No. 148434/2001) with reference to FIG. 7.

This nonvolatile memory cell is configured by two MOS transistors: a memory MOS transistor used as a storage block and a select MOS transistor used to select the memory block to read information therefrom. The select MOS transistor diffusion layer (source region) 607B is connected to a common line while the select gate electrode 603 is connected to a select-word line. On the other hand, the memory MOS transistor diffusion layer (drain region) 607A is connected to a bit line while the memory gate electrode 605 is connected to a memory word line.

The memory MOS transistor gate capacitor insulator film 604 is formed with a three-layer film, for example, comprising a silicon oxide film (the first layer film) 604a, a silicon nitride film (the second layer film) 604b, and a silicon oxide film (the third layer) 604c formed sequentially on the surface of the silicon substrate 661. Each film thickness is as follows; the first layer 604a is about 3 to 4 nm, the second layer 604b is 10 nm and under, and the third layer 604c is about 2 to 4 nm.

The silicon nitride film formed as the second layer 604b of the memory MOS transistor is actually a charge trapping insulator film (layer) provided with a charge, trapping function. The silicon nitride film traps carrier electrons on the trapping levels formed in the silicone nitride film and at each interface between the silicone nitride film and its upper film and between the silicon nitride film and its lower film. The charge trapping film may be any of a silicon nitride film, a silicon oxynitride film, a tantalum oxide film, etc. The first layer 604a and the third layer 604c are actually potential barrier films, for example, silicon oxide films and/or silicon oxynitride films.

To write information in this nonvolatile memory cell, a predetermined voltage is applied to the diffusion layer (source region) 607B and the gate electrode 603 of the select MOS transistor to turn on the select MOS transistor and a predetermined voltage is applied to the diffusion layer (drain region) 607A and the gate electrode 605 of the memory MOS transistor. At this time, some of the carrier electrons existing on the surface of the silicon substrate are injected into the gate capacitor insulator 604 due to the gate electrical field of the memory MOS transistor. The injected carrier electrons pass through the potential barrier of the silicon oxide film 604a (the first layer) to be trapped in the silicon nitride film (the second layer).

Information is erased from the nonvolatile memory cell in two ways. In one way, carrier electrons are ejected from the silicon nitride film 604b formed as a charge trapping film of the memory MOS transistor towards the silicon substrate 601 through the silicon oxide film 604a formed as a potential barrier film formed beneath the film 604b. In the other way, carrier electrons are ejected to the gate electrode 605 of the memory MOS transistor through the silicon oxide film 604c formed as the third layer. Both of the methods apply a voltage to the gate electrode 605 of the memory MOS transistor to eject the carrier electrons from the silicon nitride film 604b to erase information from the nonvolatile memory cell. The latter method can erase information from the nonvolatile memory cell with use of the same polarity as that used in the write operation has; an advantage that the circuit configuration is simplified; thereby the chip area is reduced.

To read information from the nonvolatile memory cell, it is checked first whether or not a predetermined current flows in the select MOS transistor according to the state of the threshold voltage of the memory MOS transistor when the select MOS transistor is turned on. Stored information is read from the memory cell when the current flows in the transistor.

Next, a brief description will be made for both structure and operation of a memory cell of the type disclosed in the patent document 3 (the official gazette of U.S. Pat. No. 5,969,383) with reference to FIG. 8.

This nonvolatile memory cell is also configured by two MOS transistors; a memory MOS transistor that forms a storage block and a select MOS transistor used to select the memory block to read information therefrom. The select MOS transistor diffusion layer (source region) 707B is connected to a common line while the, select gate electrode 703 is connected to a select-word line. On the other hand, the memory MOS transistor diffusion layer (drain region) 707A is connected to a bit line while the memory gate; electrode 705 is connected to a memory word line.

The memory MOS transistor gate capacitor insulator film 704 is formed as a three-layer film. For example, it consists of a silicon oxide film (the first layer film) 704a, a silicon nitride film (the second layer film) 704b, and a silicon oxide film (the third layer film) 704c formed sequentially on the surface of a silicon substrate 701. Each film thickness is as follows; the first layer 704a is about 5 to 15 nm, the second layer 704b is about 5 to 15 nm, and the third layer film 704c is about 5 to 15 nm. Reference numeral 709 denotes an insulator film.

To write information in this nonvolatile memory cell, a predetermined voltage is applied to the diffusion layer (source region) 707B and the gate electrode 703 of the select MOS transistor to turn on the select MOS transistor and a predetermined voltage is applied to the diffusion layer (drain region) 707A and the gate electrode 705 of the memory MOS transistor respectively. At this time, for example, 0 V is applied to the source region 707B, 1 to 2 V is applied to the gate electrode of the select MOS transistor, 3 to 5 V is applied to the drain region 707A, and 8 to 10 V is applied to the gate electrode 703 of the memory MOS transistor to inject electrons into the silicon nitride film 704b that is part of the gate capacitor insulator.

To erase information from the nonvolatile memory cell, a negative bias is applied to the memory gate electrode 705 and a positive bias to the diffusion layer 707A of the memory MOS transistor respectively to inject hot hales into the charge trapping film by means of band-to-band tunneling. For example, 5 to 7 V is applied to the drain region 707A, −9 to −1 V is applied to the gate electrode of the memory MOS transistor, and 0 V is applied to the gate electrode 703 of the select MOS transistor respectively or the gate electrode 703 is opened.

To read information from the nonvolatile memory cell, it is checked first whether or not a predetermined current flows in the select MOS transistor according to the state of the threshold voltage of the memory MOS transistor when the select MOS transistor is turned on. Stored information is read from the memory cell when the current flows in the transistor.

SUMMARY OF THE INVENTION

The inventor and et al of the present invention have been involved in the research and development of nonvolatile semiconductor memory devices and examined various items for enhancing the performance of the devices.

For example, the inventor et al of the present invention have examined methods for speeding up writing and erasing, methods for suppressing degradation of the transcondactance Gm when in writing and erasing, methods for realizing device structures for improving the charge retention characteristics, and methods for realizing fast writing and erasing.

And, as a result of such examinations to be described later in detail, the inventor et al of the present invention have found that writing and erasing are speeded up and the charge retention characteristics are improved with use of a silicon oxynitride film as a charge trapping insulator film.

The silicon oxynitride film characteristics have not been examined in detail yet in the prior art, although the patent document 1, etc. describe that a silicon oxide film, tantalum oxide film, or silicon oxynitride film of which oxide content is less than the first and third layers is used as the second layer provided with a charge trapping function.

Furthermore, the inventor et al of the present invention forwarded the examination and found that the use of a silicon oxynitride film as a charge trapping insulator film further improves the above characteristics while the transcondactance Gm is degraded. The degradation of this transcondactance GM will be described later in detail.

Under such circumstances, it is the present invention may improve the performance of the nonvolatile semiconductor memory device.

More particularly, the present invention improves the charge retention characteristics, suppress degradation of the transcondactance Gm, and speeds up the operation of the nonvolatile memory.

These together with other features of the present invention will become more apparent in the detailed description which follows and the accompanying drawings.

Typical aspects of the present invention, which are included in those disclosed in this specification, will be summarized as follows.

According to an aspect of the present invention, the nonvolatile semiconductor memory device comprises (a) first and second semiconductor regions formed in a semiconductor substrate, (b) first and second conductors formed on the semiconductor substrate between the first and second semiconductor regions, (c) a first insulator film formed between the first conductor and the semiconductor substrate, and (d) a second insulator film formed between the second conductor and the semiconductor substrate, (e) wherein the second insulator film consists of a potential barrier film formed on the semiconductor substrate and a silicon oxynitride film formed on the potential barrier film. The second conductor is positioned on the silicon oxynitride film.

According to another aspect of the present invention, the nonvolatile semiconductor memory device comprises (a) first and second semiconductor regions formed in a semiconductor substrate, (b) first and second conductors formed on the semiconductor substrate between the first and second semiconductor regions, (c) a first insulator film formed between the first conductor and the semiconductor substrate, and (d) a second insulator film formed between the second conductor and the semiconductor substrate, (e) wherein the second insulator film consists of a potential barrier film formed on the semiconductor substrate and a charge trapping film, (f) wherein the charge trapping film consists of a silicon oxynitride film and a third insulator film in which the sum of an energy between the vacuum level and the film conductor and the band gap of the film is smaller than that of the silicon oxynitride film, and the product of the charge trap density and the film thickness of the silicon oxynitride film is larger than that of the third insulator film.

According to still another aspect of the present invention, the nonvolatile semiconductor memory device comprises (a) first and second semiconductor regions formed in a semiconductor substrate, (b) first and second conductors formed on the semiconductor substrate between the first and second semiconductor regions, (c) a first insulator film formed between the first conductor and the semiconductor substrate, and (d) a second insulator film formed between the second conductor and the semiconductor substrate, (e) wherein the second insulator film consists of a potential barrier film formed on the semiconductor substrate and a silicon oxynitride film formed on the potential barrier film, (f) wherein the silicon oxynitride film has a charge trapping function and electrons trapped in the silicon oxynitride film are erased by holes injected from the semiconductor substrate side.

DETAILED DESCRIPTION OF THE PREFERRED EMBODIMENTS

Figures 1, 2:
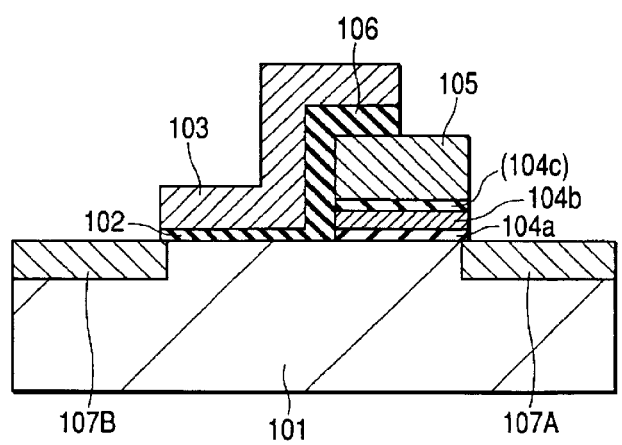
FIG. 1 is a cross sectional view of a major part of a nonvolatile memory cell in the first embodiment of the present invention.
FIG. 2 is a table of conditions for applying a voltage to a nonvolatile memory cell in the first embodiment of the present invention.

Hereunder, the preferred embodiments of the present invention will be described in detail with reference to the accompanying drawings. In order to avoid redundant description, the same reference numerals will be used for the same functional items in all the accompanying drawings.
First Embodiment Before describing this first embodiment, some items examined beforehand by the inventor et al of the present invention will be described.

At first, the inventor et al of the present invention examined a relationship among writing/erasing characteristics, reading characteristics, and charge retention characteristics using various types of charge trapping films of the memory MOS transistor as parameters.

Figure 9:
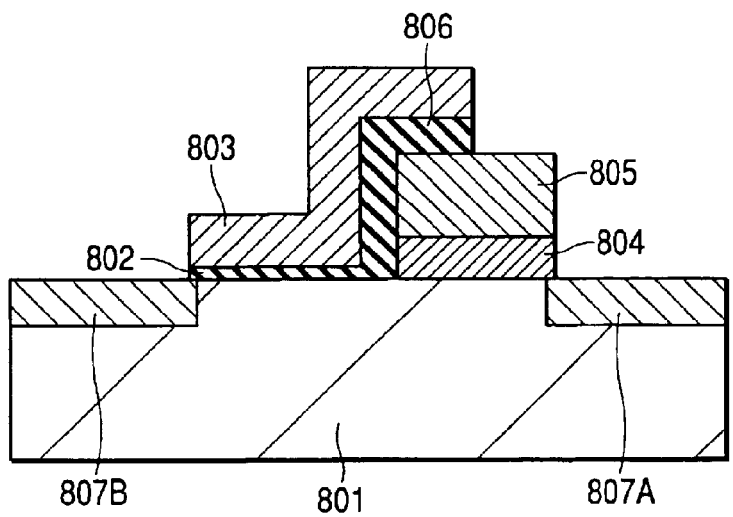
FIG. 9 is a cross sectional view of a major part of a nonvolatile memory cell examined beforehand by the inventor et al of the present invention.

FIG. 9 shows a cross sectional view of a structure of a memory cell (nonvolatile semiconductor memory device, flash memory) used in this examination. Basically, the cell structure shown in this FIG. 9 is the same as that shown in FIG. 7. However, FIG. 9 differs from FIG. 7 in that the select gate electrode 803 of the select MOS transistor is stuck partially on the gate electrode 805 of the memory MOS transistor. The memory MOS transistor capacitor insulator film 804 is formed as a three-layer one, that is, comprising a lower potential barrier film, a charge trapping film, and an upper potential barrier film formed sequentially on a silicon substrate 801.

Information is written in the memory cell by injecting hot electrons generated in the select MOS transistor and accumulated in the channel block into a charge trapping film that is part of the memory MOS transistor capacitor insulator film 804 until a predetermined threshold value is reached. Such a writing method is referred to as the hot electron injection method. When hot electrons are injected from the source side, the method is referred to as the source side injection method.

Information is erased from the memory cell by applying a positive voltage to the memory MOS transistor gate electrode 805 until a predetermined threshold value is reached. In that connection, the electrons are ejected from the charge trapping film to the memory gate electrode.

The charge retention characteristics were evaluated by writing information in the memory cell until a predetermined threshold value is reached (step 1), concretely, applying 1.8 V to the memory MOS transistor gate electrode (step 2), leaving the memory cell for 100,000 seconds at 85° C., then comparing the threshold value just after the writing with that after the leaving at the high temperature (step 3).

A silicon nitride film, a silicon oxynitride film, a tantalum oxide film, and an aluminum oxide film were used as charge trapping films respectively. The potential barrier films formed on and beneath the charge trapping film were silicon oxide films. The lower potential barrier film was 4 nm in thickness and the upper potential barrier film was 1.8 nm in thickness.

When a silicon nitride film and a silicon oxynitride film were used as charge trapping films for evaluating the writing characteristics, the writing was completed within the predetermined time. On the contrary, when a tantalum oxide film and an aluminum film were used as charge trapping films, the writing was not completed within the predetermined time. Particularly, when a tantalum oxide film was used, the predetermined threshold value was not reached even after writing for a long time. This might be because the electron trap level density of the tantalum oxide film and the aluminum film was smaller than that of the silicon nitride film and the silicon oxynitride film. When an aluminum film was used, however, the erasing characteristics and the charge retention characteristics were good, so that the aluminum film could be used effectively as the charge trapping film of nonvolatile memories that are not required of fast writing.

On the other hand, it was newly found that the use of the silicon oxynitride film as a charge trapping film was effective to speed up erasing and obtain excellent charge retention characteristics more than the use of the silicon nitride film in the evaluation of the erasing characteristics and the charge retention characteristics. And, the same effect was also obtained from a laminated charge trapping film comprising a silicon oxynitride film and a silicon nitride film. However, this was limited only when the silicon oxynitride film was thicker than the silicon nitride film, that is, when the charge retention value of the silicon oxynitride film is larger than that of the silicon nitride film.

The reason why the use of a silicon oxynitride film as a charge trapping film is effective to speed up the erasing such way is conjectured as follows from the current-voltage characteristics of the silicon nitride film and the silicon oxynitride film.

Generally, the silicon nitride film denotes a P-F type transfer mechanism while the silicon oxynitride film denotes an intermediate transfer mechanism between the P-F type and the F-N type.

Consequently, if both transfer mechanisms are compared with each other with use of an electrically equal film thickness (the physical film thickness of the silicon oxynitride film having a smaller dielectric constant is thinner), the leak current at the high electrical field side becomes larger in the silicon oxynitride film while the leak current at the low electrical field becomes larger in the silicon nitride film.

It is expected that the silicon oxynitride film having a large leak current at the high electrical field side is more effective to speed up the erasing operation than the silicon nitride film, since a high electrical field is applied to the charge trapping film during the erasing operation.

On the contrary, the characteristics of leak current at the low electrical field side become dominant in the charge-trapped state. Consequently, it is expected that the silicon oxynitride film having less leak current at the low electrical field side is effective to improve the charge retention characteristics more than the silicon nitride film.

The charge retention characteristics (threshold voltage variation) is affected by the movement of thee carrier electrons trapped in the charge trapping film in the direction of the film thickness (movement towards the silicon substrate and the gate electrode), as well as by the diffusion of the carrier electrons in the traversal direction.

Figure 10:
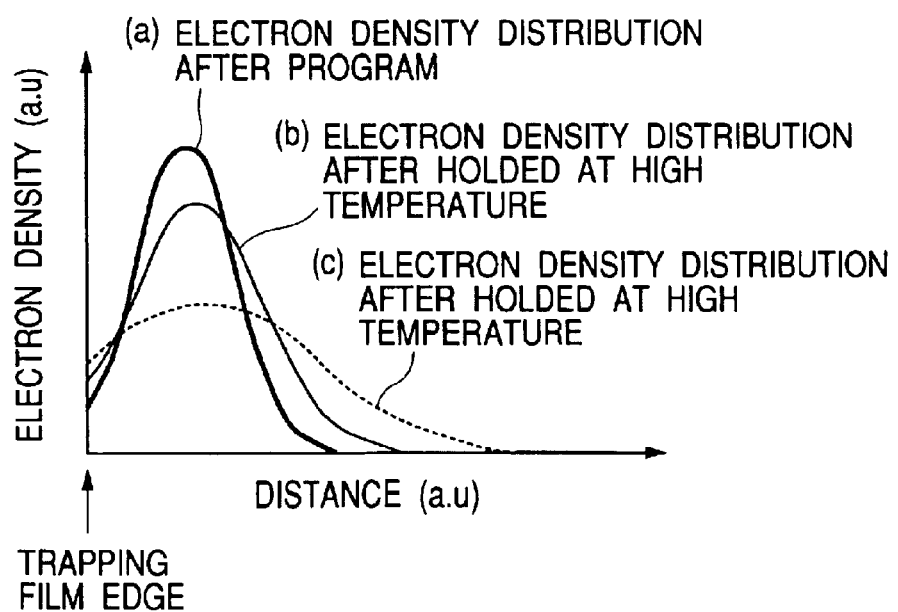
FIG. 10 is an explanatory graph for denoting the traverse distribution of electrons in a charge trapping film.

FIG. 10 shows an explanatory view of the electrons distribution (electron density distribution) in the comparison between just after a writing operation and after the leaving at a high temperature. The horizontal axis denotes a length of the charge trapping film from the film edge in the traversal direction (towards the memory MOS transistor source region). FIG. 10A shows electron density distribution in the charge trapping film just after a writing operation. FIG. 10B shows electron density distribution in the charge trapping film after the leaving at a high temperature. FIG. 10C shows electron density distribution in the charge trapping film (silicon nitride film) after the leaving at a high temperature.

The electrons trapped in the silicon nitride film and the silicon oxynitride film are affected by the self-bias and the ambient temperature and diffused also crosswise within a limited time. This electron diffusion is considered to depend on the trapping level energy (trapping depth) for trapping electrons and its depth. In the comparison between the electron trapping level energies, no remarkable difference appears between the silicon nitride film and the silicon oxynitride film except that the trapping density of the silicon oxynitride film becomes smaller than that of the silicon nitride film.

The trapping density is apt to decrease as the oxygen concentration in the silicon oxide film increases. Consequently, the electrons injected into the silicone nitride film are expected to be suppressed from diffusion not only in the direction of the film thickness, but also in the traversal direction of the film.

As described above in detail, when a silicon oxynitride film was used as a charge trapping film, the writing speed, the erasing speed, and the charge retention characteristics were all improved more than when a silicon nitride film was used as the charge trapping film.

In that case, however, when writing/erasing is repeated, the use of the silicon oxynitride film comes to have the following disadvantage; the transcondactance Gm (the mutual conductance assumed as current supply performance) is apparently degraded more than when a silicon nitride film is used.

The cause of the Gm degradation was checked for a memory cell in which a silicon oxynitride film formed as a charge trapping film and it was found that the Gm degradation was caused by the degradation of the lower potential barrier film (bottom silicon oxide film) formed beneath the charge trapping film. For example, the degradation was caused by an increase of the oxide-trapped charge in the film, the interface trapped charge, etc. It was also found that the degradation of the bottom silicon oxide film occurred in the erasing operation and the holes generated in the charge trapping film at the time of erasing was the main cause of the degradation of the bottom silicon oxide film.

Consequently, the inventor et al of the present invention took the following measures to improve the Gm of the memory cell in which a silicon oxynitride film was formed as a charge trapping film.

As described above, when a silicon oxynitride film is formed as a charge trapping film, the degradation of the Gm during writing/erasing in/from a nonvolatile memory transistor is mainly caused by the quality degradation of the bottom silicon oxide film (the potential barrier film against the silicon substrate) to occur during the erasing.

And, to suppress such degradation of the bottom oxide film during the erasing, the following methods are found to be effective; (1) lowering the efficiency of hole generation in the charge trapping film, (2) lowering the transport factor of the generated holes to the silicon substrate.

At first, a description will be made for a method that ejects electrons from the charge trapping film to the gate electrode of the memory MOS transistor to erase information. To lower the efficiency of hole generation in the charge trapping film, it is most effective to lower the erasure voltage. And, to lower the erasure voltage, it is indispensable to reduce the memory MOS transistor capacitor insulator film (including the charge trapping film) in thickness.

However, it is limited to reduce each layer film in thickness as follows. The lower potential barrier film that is in contact with the silicon substrate must be thick enough to prevent tunneling of the electrons trapped in the charge trapping film to the silicon substrate. This is why the equivalent silicon oxide comes to be limited in thickness only to about 3 nm.

Reducing the charge trapping film in thickness such way, however, is not good for realizing any nonvolatile memory, since it increases the writing time.

The most effective method to cope with such a limitation and realize the reduction of the erasure voltage is to reduce the thickness of the potential barrier film formed on the charge trapping film. Concretely, the equivalent silicon oxide thickness should preferably be 1 nm and under. More preferably, the upper potential barrier film should not be formed. Strictly speaking, a native oxide film of about 0.5 nm in thickness is formed on the surface of the charge trapping film. For example, when the upper potential barrier film and the memory gate electrode formed on the barrier film are formed in different treatment chambers, a native oxide film is formed on the surface of the charge trapping film as a result of exposure of the semiconductor wafer to the air, for example, when the wafer is transferred.

Consequently, the upper potential barrier film should preferably be 1 nm and under in thickness. More preferably, the upper potential barrier film should be limited to 0.5 nm and under in thickness, which is the thickness of the native film. Furthermore, the upper potential barrier film should not be formed. And, to avoid forming of the native oxide film as far as possible, for example, the semiconductor wafer should not be exposed to the air (oxygen) between treatment processes and an effective measure should be taken to remove the native oxide film before the memory gate electrode is formed. Concretely, it is recommended to use an apparatus provided with a load lock chamber, a transfer chamber, and a plurality of reactive chambers to make it possible to form memory gate electrodes continuously without exposing the semiconductor wafer to the air after forming charge trapping film, thereby the native oxide film is reduced in thickness.

Next, a description will be made for a structure of the nonvolatile semiconductor memory device in this embodiment and a method for driving the device.

FIG. 1 shows a cross sectional view of a nonvolatile memory cell in the first embodiment of the present invention. The wiring laid actually in the upper layer is omitted here.

The memory cell is configured by two MOS transistors (a select MOS transistor and a memory MOS transistor); each of which is provided with a p-type well region 101 formed on a silicon substrate, an n-type diffusion layer (n-type semiconductor region) formed as a source region 107B, and an n-type diffusion layer formed as a drain region 107A.

The select MOS transistor is configured by a silicon oxide film formed as a gate insulator film 102 and an n-type polycrystalline silicon film (hereinafter, to be just described as a silicon film) formed as a select gate electrode (conductor) 103.

The memory MOS transistor is configured by a silicon oxide film formed as a lower potential barrier film 1104a against the p-type well region 101, a silicon oxynitride film formed as a charge trapping film 104b, a silicon oxide film formed as an upper potential barrier film 104c against the memory gate electrode 105, and an n-type polycrystalline silicon film formed as a memory gate electrode 105.

As an example of this embodiment, the capacitor insulator film formed between the memory gate electrode 105 and the silicon substrate (p-type well region 101) consists of two layers from which the upper potential barrier film 104c is omitted.

The gate electrodes 103, 105 of the two transistors are separated electrically from each other with a silicon film formed as a gap insulator film 106 there between. This gap insulator film 106 is formed in a layer different from that of the gate insulator film 102 of the select MOS transistor.

The gate insulator film 102 of the select MOS transistor and the lower potential barrier film 104a against the p-type well region 101 of the memory MOS transistor are, for example, silicon films formed by oxidizing the p-type well region 101 thermally in an oxidative atmosphere respectively and they are 3 nm and 4 nm in thickness. While thermal-oxidation is employed for forming the gate insulator film 102 of the select MOS transistor and the lower potential barrier film 104a against the p-type well region 101 of the memory MOS transistor here, the films 102 and 104a may be replaced with silicon oxynitride films formed by nitriding a thermal-oxide film in such a nitriding atmosphere as nitric oxide gas (NO), nitrous oxide gas (N2O), etc. respectively.

The silicon oxynitride film is formed as the charge trapping film 104b with the CVD (Chemical Vapor Deposition) method using, for example, dichlorosilane (SiH$_2$Cl$_2$) ammonia (NH$_3$), and nitrous oxide as material gases. The temperature for forming the silicon oxynitride film was 780° C. and the total pressure was 60 Pa. The oxygen concentration in the film was set at 25% by adjusting the flows of both ammonia and nitrous oxide.

While the thermal CVD method that uses dichlorosilane (SiH$_2$Cl$_2$), ammonia (NH$_3$), and nitrous oxide as material gases is employed here as a method for forming the silicon oxynitride film, the present invention is not limited only to those material gases; it is possible to use hydrogen-silicon compounds such as monosilane (SiH$_4$), disilane (Si$_2$H$_6$), etc., halogen-silicon compounds such as silicon tetrachloride (SiCl$_4$), silicon hexachloride (SiCl$_6$), etc. as a silicon supply source (silicon compounds) and use hydrazine, nitric oxide, etc. as supply sources of oxygen and nitrogen (oxygen compounds, nitrogen compounds) of course. In other words, it is possible to form the silicon oxynitride film with the CVD method that uses oxygen compounds, nitrogen compounds, or silicon compounds and other compounds that include oxygen and nitrogen as materials. Another CVD method such as the plasma CVD method, the catalyst-CVD method, etc. may also be used as the method for forming the above-described film. The spattering (physical evaporation method, PVD method) may also be used for forming the silicon oxynitride film. For example silicon is subjected to spattering in an oxidative atmosphere and in a nitriding atmosphere respectively to form the silicon oxynitride film.

The silicon oxynitride film formed as the charge trapping film 104b such way is a deposited film. If this silicon oxynitride film is represented as Si$_x$O$_y$N$_z$, it is possible to change the oxygen concentration; y and the nitrogen concentration; z by changing the introduction ratio for each of the oxygen and nitrogen sources.

If the silicon oxynitride film is represented as Si$_x$O$_y$N$_z$, the oxygen (O) in the film is always combined with two silicon molecules and nitrogen (N) is always combined with three silicon molecules (it is assumed that there is no silicon dangling bond in that connection). Then, the x, y, and z in the Si$_x$O$_y$N$_z$ come to satisfy $4x=2y+3z$ at $x+y+z=1$.

For example, the nitrogen concentration should preferably be 31.4% and over ($Z \geq 0.314$). The oxygen concentration should preferably be over 5% to 30% ($0.05 \leq y \leq 0.3$).

On the other hand, the nitrogen concentration in the silicon oxynitride film (formed by nitriding a thermal oxide film) usable as the select MOS transistor gate insulator film and the memory MOS transistor lower potential barrier film 104a is 7% at the most ($z=0.07$).

The upper potential barrier film 104c against the memory gate electrode 105 of the memory MOS transistor is formed, for example, by oxidizing a silicon oxynitride film thermally, then forming the surface as a silicon oxide film.

In this embodiment, the silicon oxide film 104c was formed at a film thickness of 0 to 2.5 nm and five films 104c were prepared as samples. Each sample memory MOS transistor was fixed at the electric capacity of the capacitor insulator film (equivalent silicon oxide thickness) by adjusting the thickness of the silicon oxynitride film used as the charge trapping film 104b. The configuration of the capacitor insulator film of the memory MOS transistor in this embodiment corresponds to those in the columns 1 and 2 shown in FIG. 11. The items in FIG. 11 will be described later in detail in the second embodiment of the present invention.

The tolerable range of the film thickness of the silicon oxynitride film 104b shown in this embodiment is decided as follows; the upper limit is decided by the erasing time and the lower limit is decided by the charge trapping characteristics. The physical film thickness (real film thickness) should be 30 nm and under when in erasing and 10 nm and over for the charge trapping characteristics. More preferably, the film thickness should be over 12 nm to 20 nm.

FIG. 2 shows an example of the operation of the memory cell shown in FIG. 1 and a method for applying a voltage to the memory cell. Here, electrons injection into the charge trapping film 104b is defined as writing (programming). The hit electron programming method that uses source side injection is employed for writing. The voltage (Vs) applied to the source region 107B was 5 V and the voltage (Vd) applied to the drain region 107A was 0 V. The voltage (Vmg) applied to the (105) was 10 V. The voltage (Vsg) applied to the select MOS transistor gate electrode 103 was almost the same as the threshold voltage (Vt) of the transistor. The hot electrons were generated in a channel block beneath a region in which the gate electrodes 103, 105 of two transistors were insulated. The threshold voltage of the memory MOS transistor was set at 4 V for writing. The Vwell denotes a voltage applied to the p-type well region 101.

Information was erased from the memory cell by ejecting the electrons therefrom towards the memory gate electrode 105 with a positive voltage applied to the gate electrode 105 of the memory MOS transistor. In this embodiment, the voltage (Vmg) applied to the gate of the memory MOS transistor of each sample was adjusted so that the threshold voltage of the transistor became −1 V within a predetermined time. The voltage conditions and the absolute writing/erasing threshold values shown in FIG. 2 are just examples. The present invention is not limited by those values. Because the same polarity (of the voltage applied to the memory gate electrode) is used for both erasing and writing, the circuit configuration is simplified; thereby the chip area is reduced.

Figure 3:
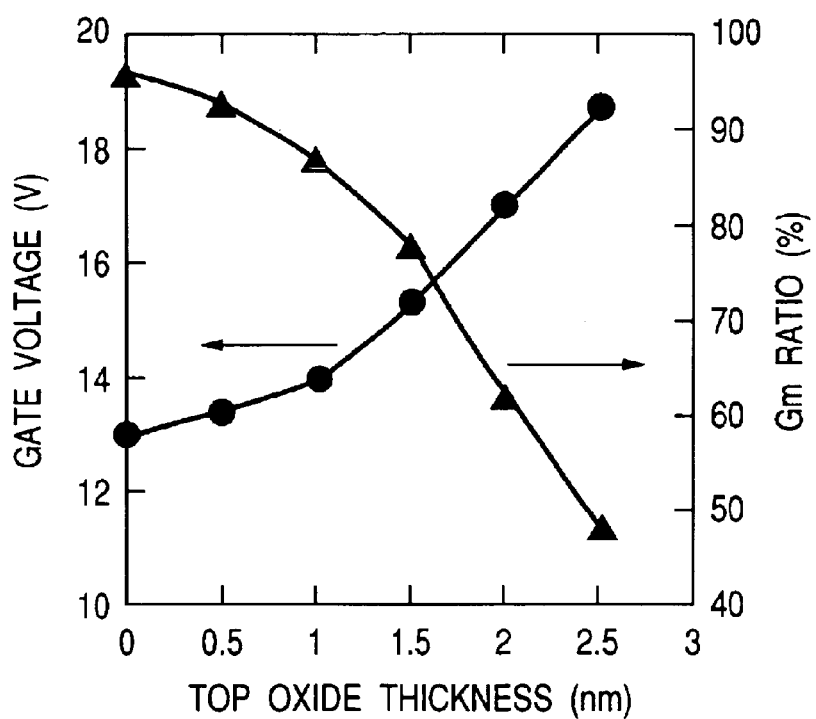
FIG. 3 is a graph of the effects obtained by the first embodiment of the present invention.

FIG. 3 shows a relationship among the thickness (nm) of the upper potential barrier film (silicon oxide film) 104c, the voltage (V) of the erasure gate, and the Gm ratio (%). The Gm ratio is a standardized Gm value obtained after repeating the writing/erasing 1000 times with the initial Gm. The smaller the Gm value becomes, the more the degradation proceeds. As the upper potential barrier film 104c against the memory gate electrode 105 is reduced more in thickness, the more the erasure gate voltage fell and the more the Gm ratio was improved. Particularly, when the thickness of the upper potential barrier film 104c was reduced by 1 nm and over, the Gm degradation was remarkably improved. For example, the Gm ratio became about 87% when the film thickness was 1 nm and the Gm ratio became about 95% when the film thickness was 0.5 nm. When the upper potential barrier film 104c was not formed, the Gm ratio became about 97%. The charge trapping characteristics were good for every sample.

Figure 7:
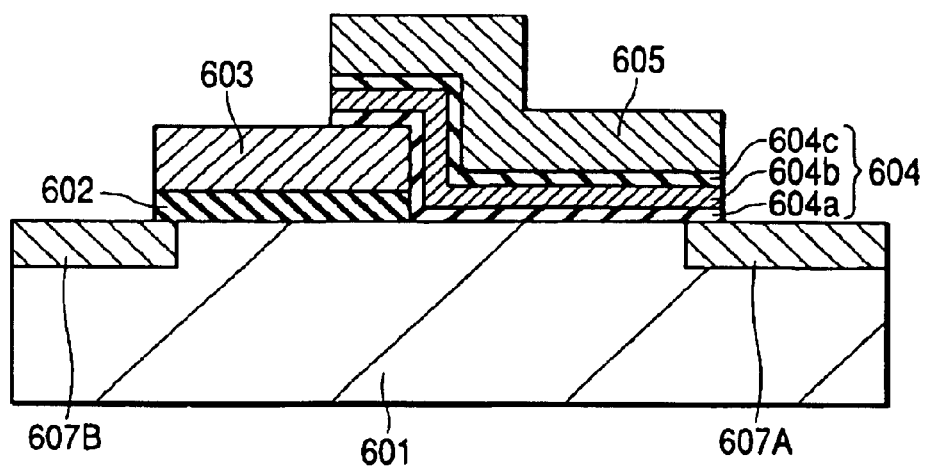
FIG. 7 is a cross sectional view of a major part of a conventional nonvolatile memory cell compared with the nonvolatile memory cell of the present invention.
Figure 8:
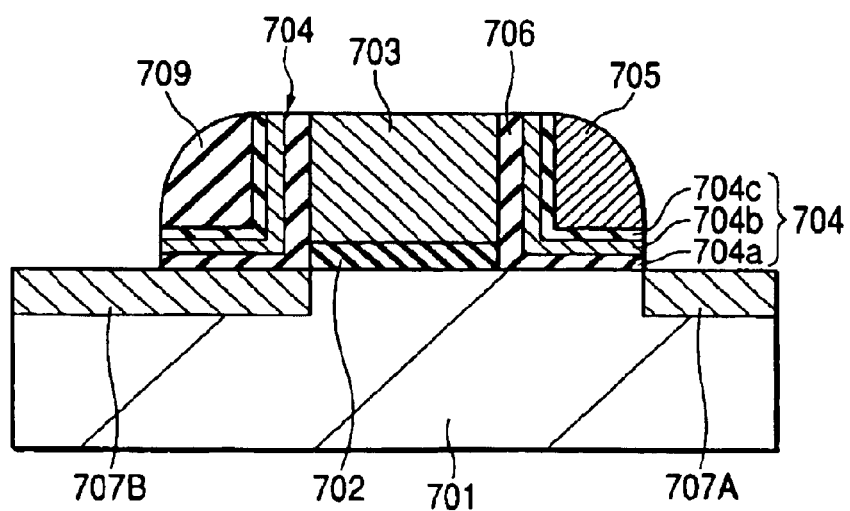
FIG. 8 is a cross sectional view of a major part of a conventional nonvolatile memory cell compared with the nonvolatile memory cell of the present invention.

While the select MOS transistor gate electrode 103 is laid partially on the memory MOS transistor in this embodiment, the converse is also possible, that is, the gate electrode 103 of the memory MOS transistor may be laid partially on the select MOS transistor (as shown in FIG. 7) to obtain the same effect. And, the Gm ratio is improved even using an alumina film of which trapping density is smaller than that of the silicon oxynitride film as a charge trapping film, although it makes the writing slow down.

While a description has been made for a nonvolatile memory formed on a single crystalline silicon substrate in this embodiment, the present invention is not limited only to this substrate. For example, it is also possible to use a strained silicon substrate formed by depositing SiGe (silicon germanium) on a silicon substrate and an SOI (silicon on insulator) substrate having single crystalline silicon. It is also possible to mount the nonvolatile memory of the present invention together with thin film transistors (TFT) (high temperature polycrystalline silicon TFT, low temperature polycrystalline silicon TFT) on a glass substrate. However, the low temperature polycrystalline silicon TFT device is limited in process temperature (ex. 550° C. and under), so that the plasma CVD method and the sputtering method must be used for forming capacitor insulator films and gate electrodes. Particularly, the electron cyclotron resonance (ECR) sputtering method that can obtain good quality insulator films even at low temperatures (ex. 550° C. and under) should be used for forming capacitor insulator films.

Second Embodiment

While a description is made in detail for a case in which a silicon oxynitride film is used as a charge trapping film in the first embodiment, this charge trapping film may also be formed with a laminated film comprising a silicon oxynitride film and a silicon nitride film. As described above, even in that case, the erasing is speeded up and the charge trapping characteristics are improved.

Here, when a deposited film is used as a charger trapping film, "the main charge trapping film" and "the potential barrier film" are defined as follows. The "main charge trapping film" means a film having the largest product of the injected electrons trap density and the film thickness, that is, a film that has trapped electrons most. Hereunder, a description will be made for a case in which a plurality of laminated insulator films provided with a charge trapping function respectively are used as charge trapping films. For example, if it is assumed that the electron trap density values of the films A, B, and C are defined as $N_A$, $N_B$, and $N_C$ and the film thickness values of the films A, B, and C are defined as $T_A$, $T_B$, and $T_C$, as well as the relationship "$N_A \times T_A < N_B \times T_B < N_C \times T_C$" is satisfied, the main charge trapping film becomes the film C.

The electron trap density of the silicon nitride film differs slightly among film forming methods. For example, if the LP-CVD (Low Pressure Chemical Vapor Deposition) method that uses dichlorosilane and ammonium as material gases is used to form the silicon nitride film, the electron trap density becomes about $4 \times 10^{18}/cm^3$ to $7 \times 10^{18} cm^3$ (hereinafter, "$\times 10^{18}$" will be described as "e18"). If the LP-CVD method that uses dichlorosilane, ammonium, and nitride oxide gas as material gases is used to form a silicon oxynitride film, the electron trap density can be controlled within a range between silicon oxynitride film ($SiO_2$) and silicon nitride film ($Si_3N_4$) by adjusting the oxygen concentration. However, if the electron trap density is low, the writing time is extended. Actually, therefore, a charge trapping film that has a charge trap density of 5e17/cm3 and over should preferably be used.

Next, the definition of the potential barrier film will be described. A potential barrier film is defined if it functions as a potential barrier against a gate electrode even slightly from the standpoint of the electrons trapped in the charge trapping film defined above. Here, if the energy ($E_a(a)$) between the vacuum level and the conduction band of the insulator film A is smaller than the energy ($E_a (a)$) between the vacuum level and the conduction band of the insulator film B while no electric field is applied to the films A and B, the insulator film B is defined as a potential barrier against the insulator film A. In other words, whether or not an insulator film functions as a potential barrier is decided by the size of the energy between the vacuum level and the conduction band.

Figure 13:
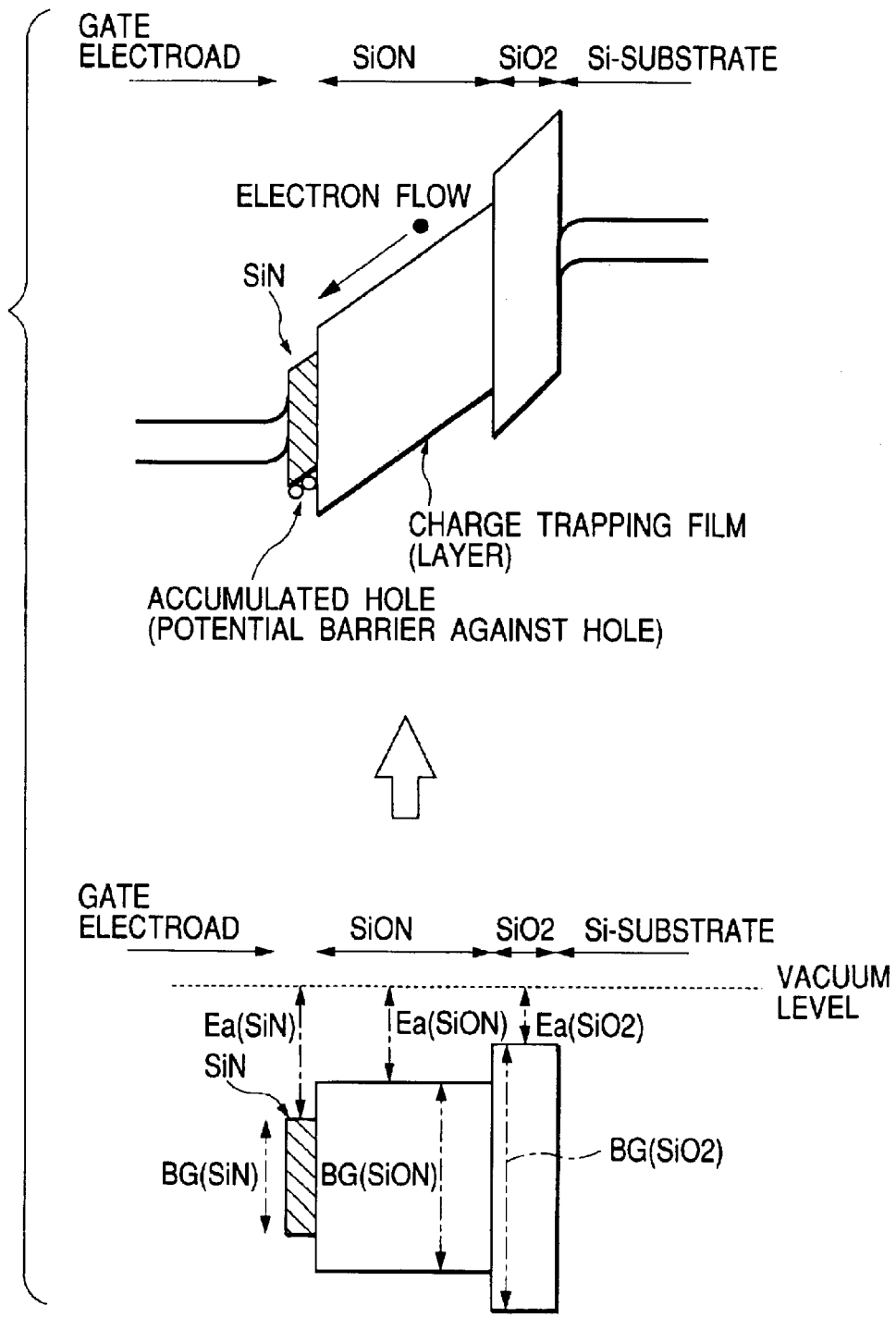
FIG. 13 is a band structure for denoting a state of a capacitor insulator film of the nonvolatile memory cell in the second embodiment of the present invention.

For example, if a bottom silicon oxide film, a silicon oxynitride film, and a silicon nitride film are laminated sequentially on a substrate and the silicon oxynitride film is defined as the main charge trapping film according to the product of the charge trap density and the film thickness, the silicon nitride film formed on the silicon oxynitride film does not function as a potential barrier, since the carrier barrier is low against the silicon oxynitride film (see FIG. 13). Generally, $E_a$ ($SiO_2$) becomes about 1 eV and $E_a$(SiN) becomes about 2 eV. Consequently, $E_a$(SiON) becomes 1 eV to 2 eV ($1\ eV < E_a(SiON) < 2\ eV$).

For example, the energy (electron affinity: k) between the vacuum level and the conduction band of the silicon substrate is 4.1 to 4.15 eV and the difference (barrier height: $\phi b1$) between the silicon substrate and the $SiO_2$ conduction band is about 3.1 eV. Consequently, the Ea (SiON) becomes a difference between the electron affinity and the barrier height (Si(k)–φb1=4.1 eV to 3.1 eV=1 eV), that is, about 1 eV.

On the other hand, the difference (barrier height: φb2) between the silicon substrate and the SiN conduction band is about 2 eV and the Ea(SiN) becomes (Si(k)–φb2=4.1 eV to 2 eV=2.1 eV), that is, about 2.1 eV. The silicon band gap is 1.12 eV.

If a bottom silicon oxide film, a silicon oxynitride film, and a silicon nitride film are laminated sequentially on a substrate and the top layer silicon oxynitride film is defined as the main charge trapping film, there comes to be no potential barrier to function against the gate electrode.

Figures 11, 12:
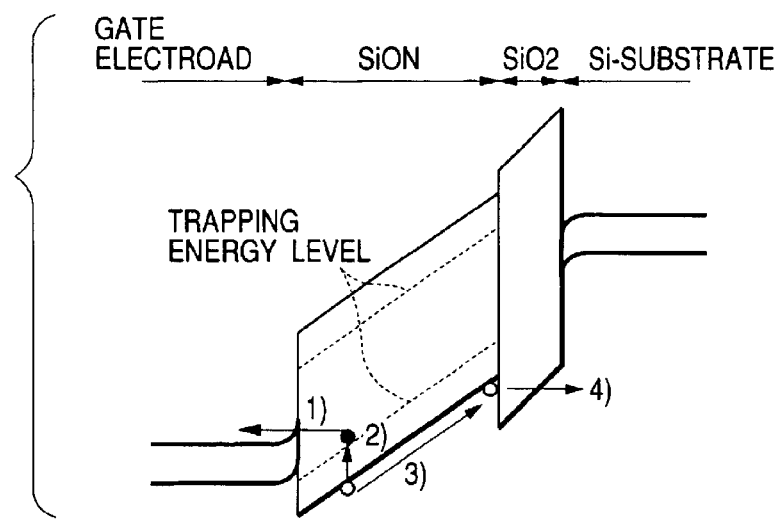
FIG. 11 is a table of configuration examples of a capacitor insulator film of the nonvolatile memory cell in the first to third embodiments of the present invention.
FIG. 12 is a band structure for denoting a hole generation model.

FIG. 11 shows a relationship between the main charge trapping film and the potential barrier film when a plurality of insulator films are combined to form a capacitor insulator film. "SiO$_2$" in FIG. 11 corresponds to a silicon oxide film, "SiN" corresponds to a silicon nitride film, and "SiON" corresponds to a silicon oxynitride film respectively.

For example, a memory cell structure as described in the first embodiment corresponds to each of those in the columns 1 and 2 in FIG. 11 and the SiO$_2$ described in the potential barrier film column, if it is thinned to 1 nm, and under as shown in the column 2, enables the erasure voltage to be lowered. Although a silicon oxide film is formed as the upper potential barrier film here, it may be replaced with an alumina film if its equivalent silicon oxide thickness is 1 nm and under. However, to further lower the erasure voltage, the potential barrier film should not be formed as shown in the column 1.

The columns 3 and 4 in FIG. 11 denote a laminated layer in which a bottom silicon oxide film, a silicon oxynitride film, and a silicon nitride film are laminated sequentially on a substrate and a laminated layer in which a bottom silicon oxide film, a silicon nitride film, and a silicon oxynitride film are laminated sequentially on a substrate. Both laminated layers include no potential barrier film against the gate electrode side.

If a plurality of silicon oxynitride films are laminated to form a charge trapping film, whether or not a silicon oxynitride film becomes a potential barrier film against a charge trapping film is decided by the difference of the oxygen concentration in itself with respect to the target charge trapping film. As shown in (a) in the column 5 in FIG. 11, while a bottom silicon oxide film, a first silicon oxynitride film (SiON(1)), and a second silicon oxynitride film (SiON(2)) are laminated sequentially on a substrate, for example, if the oxygen concentration of the charge trapping film SiON(1) is 15% and the oxygen concentration of the SiON (2) is under 15%, the bottom silicon oxide film does not function as a potential barrier film. If its oxygen concentration of the film SiON is over 15%, the bottom silicon oxide film functions as a charge trapping film.

Such way, if the oxygen concentration of a film is lower than that of the silicon oxynitride film used as a charge trapping film, the film does not function as a potential barrier. However, if the oxygen concentration of a film is higher than that of the silicon oxynitride film used as a charge trapping film, the film functions as a potential barrier. However, as described in the first embodiment, even when there is a potential barrier film between the main charge trapping film and the gate electrode, the film thickness should be set at 1 nm and under in equivalent silicon oxide thickness to suppress the Gm degradation.

As described above, because a silicon nitride film or silicon oxynitride film of which oxygen concentration is low is formed on and beneath a silicon oxynitride film used as a charge trapping film, it comes to be possible to reduce the amount of holes to be injected into the silicon substrate when in erasing. Hereinafter, this point will be described in detail.

At first, a description will be made briefly for a mechanism that generates holes when in erasing with reference to FIG. 12. FIG. 12 shows an explanatory view of a band structure comprising a silicon substrate, a potential barrier film, a charge trapping film, and a gate electrode of a memory MOS transistor when in erasing. It is expected that holes are generated even in the silicon substrate through the processes shown in FIG. 12. In the first process, electrons trapped on the trapping energy level of the charge trapping film near the memory gate electrode tunnels the memory gate electrode (1). In the second process, electrons move from the balance band to the emptied trapping energy level (2). In the third process, holes generated in the balance band move towards the silicon substrate due to an electric field (3). And, in the fourth process, the electrons go through (tunnel) the lower potential barrier film from the balance band of the charge trapping film (4). Such way, if holes go through (tunnel) the lower potential barrier film and flow into the silicon substrate, an interface-trapped charge occurs in the silicon substrate, thereby the reading current falls. As a result, the transcondactance Gm is degraded.

As described in the first embodiment, if the upper potential barrier film is omitted or thinned more, the erasure gate voltage is lowered, thereby the occurrence possibility in steps 1), 2), and 3) in FIG. 12 is reduced. Consequently, hole generation as well as GM degradation is suppressed more effectively.

On the other hand, if two or more charge trapping films having different band gaps are laminated to form a potential barrier that functions only against holes when in erasing, the GM degradation will also be suppressed effectively.

Figure 14:
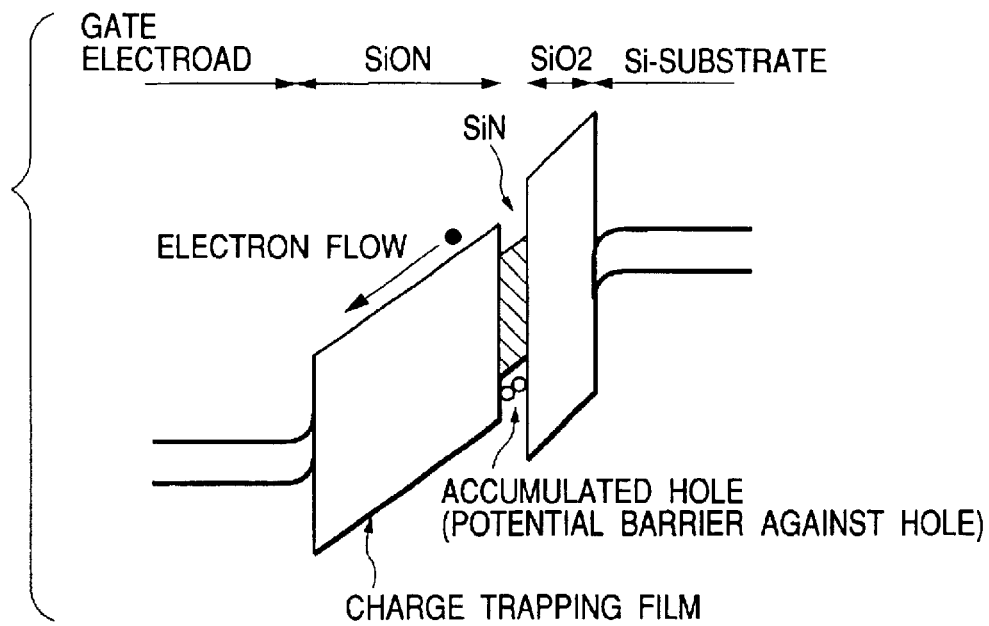
FIG. 14 is another band structure for denoting a state of a capacitor insulator film of the nonvolatile memory cell in the second embodiment of the present invention.
Figure 15:
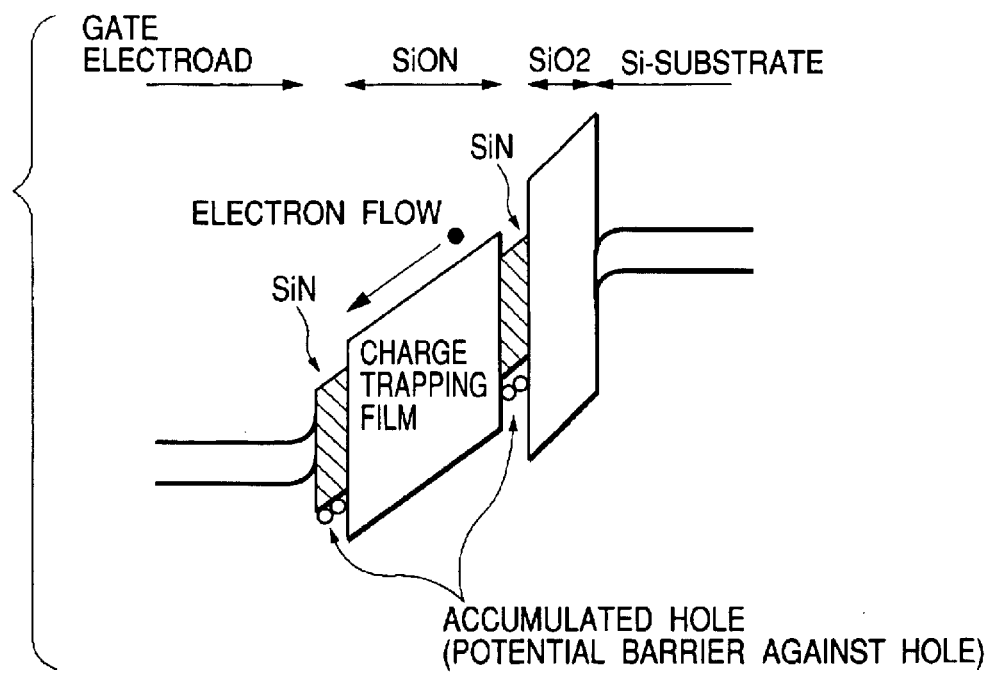
FIG. 15 is still another band structure for denoting a state of a capacitor insulator film of the nonvolatile memory cell in the second embodiment of the present invention.

FIGS. 13 through 15 show explanatory views of a band structure in which a silicon nitride film and a silicon oxynitride film are laminated. The structure shown in FIG. 13 corresponds to that in the column 3 in FIG. 11, the structure shown in FIG. 14 corresponds to that in the column 4 in FIG. 11, and the structure shown in FIG. 15 corresponds to that in the column 6 in FIG. 11. In any structure, holes are accumulated in the silicon nitride film due to the band gap difference between the silicon nitride film and the silicon oxynitride film, so that holes are prevented from tunneling the lower potential barrier film. In other words, a potential barrier is formed only against holes when an erasure voltage is applied to the memory cell.

Whether or not a potential barrier functions against holes is decided by the value of the sum of the energy between the vacuum level and the conductive band of the film and the band gap of the film. If the sum of the energy (Ea(a)) between the vacuum level and the conductive band of the insulator film A and the band gap (BG(a)) of the insulator film A is smaller than the energy (Ea (b)) between the vacuum level and the conductive band of the insulator film B and the band gap (BG(b)) of the insulator film B while no electric field is applied, the insulator film A functions a potential barrier against holes. For example, the energy between the vacuum level and the conductive band of the SiON shown in FIG. 13 is Ea (SiON) and the band gap is BG (SiON). Although those values differ slightly among manufacturing methods, the SiO$_2$ band gap (BG(SiON)) becomes about 8 eV to 9 eV while the SiN band gap (BG(SiN)) becomes about 4.4 to 5.0 eV.

While a silicon nitride film is picked up as an example in FIGS. 13 through 15, the film may be replaced with a silicon oxynitride film in which the oxygen concentration is lower (the nitrogen concentration is higher) than the silicon oxynitride film used as a charge trapping film as shown in the columns 5(a) and 7(a) in FIG. 11.

As described above, because a charge trapping film or a potential barrier film formed by laminating a plurality of insulator films having different band gaps traps holes, thereby the number of holes to be generated in the silicon substrate is suppressed. As a result, the Gm degradation is suppressed.

In other words, if a silicon oxynitride film is the main charge trapping film, the Gm degradation is suppressed by providing a silicon oxynitride film in its upper, lower, or intermediate layer. The oxygen concentration of the silicon oxynitride film is lower (the nitrogen concentration thereof is higher) than that of the silicon nitride film and the main charge trapping film.

A film that traps holes such way should preferably be formed in the upper or lower layer rather than in an intermediate layer of the main charge trapping film. This is because the film functions as a sink against those electrons when electrons trapped in the main charge trapping film are ejected towards the gate electrode, thereby the erasure time increases.

And, the examination by the inventor of the present invention came to a conclusion that the Gm degradation was suppressed more effectively when a film for trapping holes was formed beneath the charge trapping film than when it was formed on the charge trapping film, thereby the film for trapping holes should have been formed beneath the charge trapping film. This was because the potential barrier layer of the silicon substrate functioned as the most effective potential barrier against trapped holes, so that the possibility of holes that might have reached the silicon substrate was reduced.

Next, a description will be made in detail for a structure of a nonvolatile semiconductor memory device in this second embodiment. The same evaluation as that in the first embodiment was also made for the same type memory cell as that shown in FIG. 1 described in the first embodiment. This memory cell is a nonvolatile memory one formed with a select MOS transistor and a memory MOS transistor. This memory cell just differs from the memory cell in the first embodiment (FIG. 1) by the structure of the capacitor insulator film of the memory MOS transistor. The materials and forming methods of other portions are all the same between both memories in the first and second embodiments, so that the description for them will be omitted here. The operations of these memories are also the same in both first and second embodiments, so that the description for them will also be omitted here.

Figure 4:
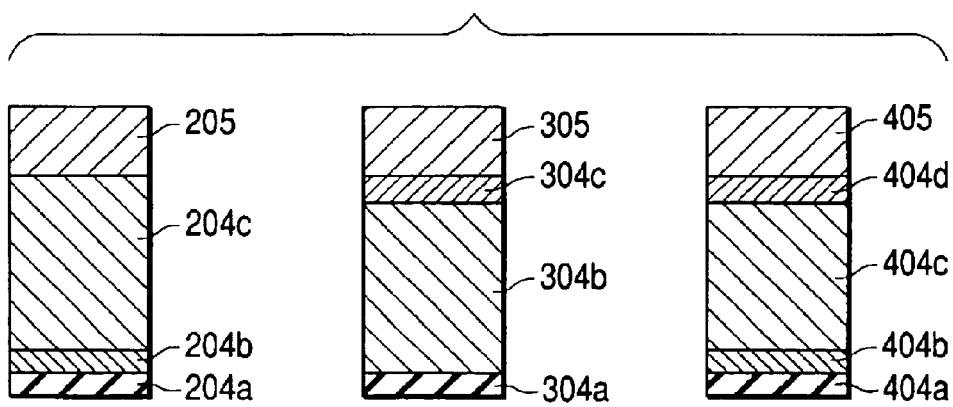
FIG. 4 is cross sectional views of major parts of a nonvolatile memory cell in the second embodiment of the present invention.

FIG. 4 shows a cross sectional view of a structure of a capacitor insulator film of the memory MOS transistor. The left illustration in FIG. 4 shows a state of the capacitor insulator film in which a silicon oxide film 204a, a silicon nitride film 204b, a silicon oxynitride film 204c, and a memory gate electrode 205 are laminated sequentially on a silicon substrate. The insulation films are 4 nm, 4 nm, and 18 nm in thickness respectively.

The silicon nitride film was formed with the LP-CVD method that uses dichlorosilane and ammonium as material gases. The charge trap density of the silicon nitride film 204b used in this second embodiment was 5e18/cm$^3$.

The silicon oxynitride film 204c could be formed just like that 104b used in the first embodiment. In this embodiment, the oxygen concentration was adjusted to obtain a charge trap density of 2e18/cm$^3$. The film thickness and the oxygen concentration preferred for the silicon oxynitride film were the same as those in the first embodiment.

Consequently, a charge trapping film structured as described above becomes the silicon oxynitride film 204c having a large product of both charge trap density and film thickness. The band structure when in erasing becomes as shown in FIG. 14 and there is no potential barrier film against the electrons trapped in the silicon oxynitride film.

On the other hand, holes generated around the memory gate electrode 205 are prevented from tunneling at a high possibility due to the large potential barrier existing at the interface between the lower oxide film 204a and the silicon nitride film 204b. Due to the two effects described above, the Gm degradation comes to be suppressed significantly.

As described above, the silicon oxide film 204a and the silicon nitride film 204b are laminated to form a capacitor insulator film of the memory MOS transistor in this embodiment. However, the silicon nitride film 204b may be replaced with a silicon oxynitride film. In other words, a silicon oxide film 204a, a silicon oxynitride film (1) 204b, and a silicon oxynitride film (2) 204c may be laminated to form the insulator film. To obtain the same effect as that shown in the left illustration in FIG. 4, however, the oxygen concentration of the silicon oxynitride film (1) 204b must be lower than that of the silicon oxynitride film (2) 204c. In addition, if both film thickness and charge trap density of each of the silicon oxynitride films (1) and (2) is assumed to be T1, N1, T2, and N2, the condition "T1<(N2×T2)/N1" must be satisfied.

The center illustration in FIG. 4 shows a state of the memory gate electrode 305 in which a silicon oxide film 304a, a silicon oxynitride film 304b, a silicon nitride film 304c, and a memory gate electrode 305 are laminated sequentially on a silicon substrate. The insulation films are 4 nm, 18 nm, and 4 nm in thickness respectively.

The forming methods and the charge trap density values of the silicon oxynitride film 304b and the silicon nitride film 304c are the same as those of the silicon oxynitride film 204c and the silicon nitride film 204b.

Consequently, a charge trapping film structured as described above becomes the silicon oxynitride film 304b having a large product of the charge trap density and the film thickness. The band structure when in erasing becomes as shown in the upper illustration in FIG. 13 and the silicon nitride film 304c does not function as a potential barrier film against the electrons trapped in the silicon oxynitride film 304b, so that low voltage erasing is possible. On the other hand, holes generated around the memory gate electrode 305 are prevented from moving towards the silicon substrate at a high possibility due to the potential barrier formed at the interface between the silicon nitride film 304c and the silicon oxynitride film 304b. Due to the two effects described above, the Gm degradation is suppressed significantly.

As described above, the silicon oxide film 304a, the silicon oxynitride film 304b, and the silicon nitride film 304c are laminated to form a capacitor insulator film of the memory MOS transistor in this embodiment. However, the silicon nitride film 304c may be replaced with a silicon oxynitride film. In other words, a silicon oxide film 304a, a silicon oxynitride film (1) 304b, and a silicon oxynitride film (2) 304c may be laminated to form the insulator film. To obtain the same effect as that shown in the center illustration in FIG. 4, however, the oxygen concentration of the silicon oxynitride film (2) 304c must be lower than that of the silicon oxynitride film (1) 304b. In addition, if both film thickness and charge trap density of each of the silicon oxynitride films (1) and (2) are assumed to be T1, N1, T2, and N2, the condition "T2<(N1×T1)/N2" must be satisfied.

The right illustration in FIG. 4 shows a state of the memory gate electrode 405 in which a silicon oxide film 404a, a silicon nitride film 404b, a silicon oxynitride film 404c, a silicon nitride film 404d, and a memory gate electrode 405 are laminated sequentially on a silicon substrate. The insulation films are 4 nm, 3 nm, 17 nm, and 3 nm in thickness respectively. The forming methods and the charge trap density values of the silicon oxynitride film 404c and the silicon nitride films 404b and 404d are the same as those of the silicon oxynitride film 204c and the silicon nitride film 204b.

Consequently, a charge trapping film structured as described above becomes the silicon oxynitride film 404c having a large product of the charge trap density and the film thickness. The band structure when in erasing becomes as shown in FIG. 15 and the upper silicon nitride film 404d does not function as a potential barrier film against the electrons trapped in the silicon oxynitride film 404c, so that low voltage erasing is possible. On the other hand, holes generated around the memory gate electrode 405 are prevented from moving towards the silicon substrate at a high possibility due to the potential barrier formed at the interface between the silicon nitride film 404d and the silicon oxynitride film 404c, as well as at the interface between the silicon nitride film 404d and the silicon, oxynitride film 404a. Due to the two effects described above, the Gm degradation is suppressed significantly.

As described above, the silicon oxide film 404a, the silicon nitride film 404b, the silicon oxynitride film 404c, and the silicon nitride film 404d are laminated to form a capacitor insulator film of the memory MOS transistor in this embodiment. However, the silicon nitride films 404b and 404d formed on and beneath the silicon oxynitride film 304c may be replaced with silicon oxynitride films. In other words, a silicon oxide film 404a, a silicon oxynitride film (1) 404b, a silicon oxynitride film (2) 404c, and a silicon oxynitride film (3) 404d may be laminated to form the insulator film. To obtain the same effect as that shown in the left illustration in FIG. 4, however, the oxygen concentration of the silicon oxynitride film (2) 404c must be higher than those of the silicon oxynitride films (1) 404b and (3) 404d. In addition, if both film thickness and charge trap density of each of the silicon oxynitride films (1), (2), and (3) are assumed to be T1, N1, T2, N2, T3, and N3, the conditions "T1<(N2×T2)/N1" and "T3<(N2×T2)/1N3" must be satisfied.

In addition, as shown in the column 7 in FIG. 11, the silicon nitride film 204b illustrated at the left in FIG. 4 may be formed by laminating a silicon oxynitride film and a silicon nitride film (see (b) in the column 7) and the silicon nitride film 304c illustrated in the center in FIG. 4 may be formed by laminating a silicon oxynitride film and a silicon nitride film (see (a) in the column 7).

While a description has been made for a nonvolatile memory formed on a single crystalline silicon substrate in this second embodiment, the present invention is not limited only to such a single crystalline silicon substrate. For example, the substrate may be replaced with a strained silicon substrate or SOI substrate. In addition, the present invention can also apply to thin film TFT devices (high temperature polycrystalline silicon TFT devices, low temperature polycrystalline silicon TFT devices) that use a glass substrate respectively.

(Third Embodiment)

While the upper potential barrier film is omitted or thinned to suppress the Gm degradation to occur when a silicon oxynitride film is used as a charge trapping film in the first embodiment, the erasing method may also be realized with hot hole injection to suppress the Gm degradation.

In other words, while a description has been made for an erasing method that ejects electrons trapped in the charge trapping film towards the memory gate in the first embodiment, another low voltage erasing method, for example, a hot hole erasing method, may be used. In this hot hole erasing method, a negative bias is applied to the memory gate electrode of the memory MOS transistor and a positive bias is applied to its diffusion layer while hot holes are injected into the charge trapping film by means of band-to-band tunneling. According to this hot hole erasing method, the erasure voltage can be reduced more than the method that applies a positive voltage to the memory gate electrode of the memory MOS transistor to eject carrier electrons therefrom. Consequently, the Gm degradation can be suppressed at the time of erasing even when a silicon oxynitride film is used as a charge trapping film.

Next, a description will be made in detail for at structure of a nonvolatile semiconductor memory device in this third embodiment and a method for driving the memory device.

Figures 5, 6:
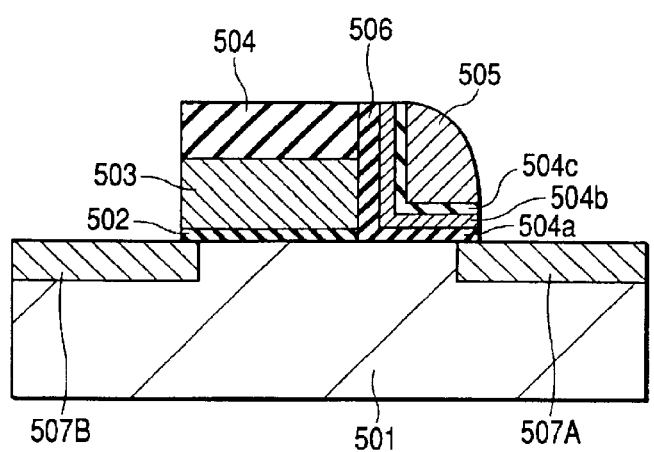
FIG. 5 is a cross sectional view of a major part of a nonvolatile memory cell in the third embodiment of the present invention.
FIG. 6 is a table of conditions for applying a voltage to a nonvolatile memory cell in the third embodiment of the present invention.

FIG. 5 shows a cross sectional view of a nonvolatile memory cell in this embodiment. Actually, wiring is laid in the upper layer of the memory cell, but it is omitted here.

The memory cell is configured by two MOS transistors; a select MOS transistor and a memory MOS transistor, each of which is provided with a p-type well region 501, an n-type diffusion layer used as a source region 507B, and an n-type diffusion layer used as a drain region 507A. The select MOS transistor is formed with a silicon oxide film used as a gate insulator film 502, an n-type polycrystalline silicon film used as a select gate electrode 503, and an insulator film 504 formed on the electrode layer. The memory MOS transistor is formed with a silicon oxide film used as a lower potential barrier film against the p-type well region 501, a silicon nitride film used as a charge trapping film 504b, a silicon oxynitride film used as a potential barrier film 504cagainst the memory gate electrode 505, and an n-type polycrystalline silicon film used as the memory gate electrode 505.

The gate electrodes 503, 505 of the two transistors are separated electrically from each other with a silicon oxide film provided there between. The silicon oxide film is used as the gap insulator film 506. This gap insulator film 506 is formed in a layer different from those of the lower potential barrier film 504a of the memory MOS transistor and the gate insulator film 502 of the select MOS transistor. The gate insulator film 502 of the select MOS transistor and the lower potential barrier film 504a against the p-type well region 501 of the memory MOS transistor are silicon oxide films formed, for example, by oxidizing the p-type well region 501 thermally in an oxidative atmosphere. The films 502 and 504a are 3 nm and 7 nm in thickness respectively.

The silicon oxynitride film used as the charge trapping film 504b may be formed just like the oxynitride film 104b in the first embodiment. In this third embodiment, however, the oxygen concentration in the film was used as a parameter to change the concentration within 0% (silicon nitride film) to 30% for examination. Because the dielectric constant of the silicon oxynitride film changes according to the oxygen concentration in the film, the physical film thickness of every sample was adjusted to be unified into one equivalent silicon oxide thickness. The silicon nitride film thickness tolerable range is decided as follows; the upper limit is decided by the erasing speed and the lower limit is decided by the writing speed. The film thickness should be 15 nm and under at the standpoint of the erasing speed, 5 nm and over at the standpoint of the writing speed, and more preferably be over 7 nm to 13 nm.

The upper potential barrier film against the memory gate electrode 505 is a silicon oxide film formed, for example, by depositing a silicon oxide film of about 6 nm in thickness with the LP-CVD method that uses dichlorosilane and nitrous oxide gas as material gases, then subjecting the same to a 10-minute thermal process in a 900° C. vapor atmosphere. The memory gate electrode 505 is formed by forming an n-type polycrystalline silicon film with the LP-CVD method, then leaving the n-type polycrystalline silicon film only at the side walls of the pattern step, by anisotropic etching.

The memory gate electrode 505 is sidewall-shaped in this embodiment. This is to further shorten the distance between the electron injection region and the hot hole injection region of the charge trapping film 504b to improve the erasing efficiency. Consequently, the hot hole erasure is also possible with use of the memory cell structured as shown in FIG. 1.

FIG. 6 shows an example of the operation of the memory cell shown in FIG. 5 and how to apply a voltage to the memory cell. Here, charge injection into the charge trapping film 504b is defined as writing (programming). The writing method is hot electron writing that employs source side injection. For example, a voltage (Vs) applied to the source region 507B is 5 V, a voltage (Vd) applied to the drain region 507A is 0 V, a voltage (Vmg) applied to the memory MOS transistor gate electrode 505 is 10 V, and a voltage (Vsg) applied to the select MOS transistor gate electrode 103 is roughly the same as the transistor threshold value (Vt). Hot electrons are generated in a channel block located beneath a region in which the gate electrodes 503, 505 of the two transistors are insulated. The transistor threshold voltage is set at 5 V when in writing.

Hot hole injection that uses the band-to-band tunneling method is employed for erasing information. The voltage (Vmg) applied to the memory MOS transistor gate electrode 505 was –6 V, the voltage (Vd) applied to the drain region 507A was 5 V to 7 V, other voltages were all 0 V to erase information from the memory cell until the transistor threshold voltage became –1 V. The voltage conditions and the absolute writing/erasing threshold voltages shown in FIG. 6 are just examples; the present invention is never limited by those values.

The evaluation result of the writing/erasing characteristics of each of the manufactured samples was as follows; the oxygen concentration of the sample charge trapping film 504b was in proportional to the writing time and in inversely proportional to the erasing time. The writing and erasing were completed within a predetermined time respectively, however. If the oxygen concentration was over 30%, however, the writing was not completed within the predetermined time. Consequently, the oxygen concentration of the silicon oxide film should preferably be within 30% at the standpoint of the writing speed. And, the oxygen concentration should preferably be 5% and over at the standpoint of the charge trapping characteristics.

An evaluation was also made for the Gm degradation after the writing/erasing was repeated by 1000 times. In the evaluation, the Gm degradation rate specific to the silicon nitride film did not increase; the value was the same as that of the silicon oxide film.

On the other hand, in the evaluation of the charge trapping characteristics, the characteristics of the silicon oxide film were better than those of the silicon nitride film. In the evaluation of the silicon oxynitride film, the higher the oxygen concentration of the sample was, the more excellent the charge trapping characteristics became. The evaluation of the charge trapping characteristics was made with use of a method for comparing the threshold value just after writing with that after leaving the sample at a high temperature. Concretely, a voltage of 1.5 V was applied to the gate electrode of the memory MOS transistor, then the electrode was left for 100,000 seconds at 14.5° C. After that, both threshold values were compared with each other. The voltage conditions, leaving temperatures, and leaving times of the charge trapping characteristics that are absolute values are just examples. The present invention is never limited by those values.

As described above, according to the first to third embodiments, it is possible to improve the charge trapping characteristics of the distributed type nonvolatile memory that uses a charge trapping film, as well as to suppress the mutual conductance degradation to be caused by repetitive writing/erasing.

While the preferred embodiments of the present invention have beer described, the present invention is not limited only to those embodiments; it is to be understood that modifications will be apparent to those skilled in the art without departing from the spirit of the invention.

Furthermore, the nonvolatile memory of the present invention may also apply to microcomputers, as well as other various apparatuses.

The typical effects to be obtained by the present invention disclosed in this specification can be summarized as follows.

It is possible to improve the performance of the nonvolatile semiconductor memory device.

Particularly, it is possible to improve the charge trapping characteristics. In addition, it is possible to suppress the degradation of the transcondactance and speed up the operation of the memory device.

Some other possible features include:

The nonvolatile semiconductor memory device wherein electrons trapped in said silicon oxynitride film are injected with a hot-electron injection method.

The nonvolatile semiconductor memory device wherein the condition z=0.314 and over is satisfied when said silicon oxynitride film is assumed as $Si_xO_yN_z$ (x+y+z=1).

The nonvolatile semiconductor memory device wherein the condition y=0.3 and under is satisfied when said silicon oxynitride film is assumed as $Si_xO_yN_z$ (x+y+z=1).

The nonvolatile semiconductor memory device wherein said silicon oxynitride film is over 10 nm to 30 nm in thickness.

The nonvolatile semiconductor memory device wherein said silicon oxynitride film is over 12 nm to 20 nm in thickness.

The nonvolatile semiconductor memory device wherein said silicon oxynitride film is a deposited film.

The nonvolatile semiconductor memory device wherein said silicon oxynitride film is formed with silicon compounds, oxygen compounds, and nitrogen compounds or silicon compounds and other compounds including oxygen, and nitrogen with use of a chemical vapor deposition method.

The nonvolatile semiconductor memory device wherein said silicon oxynitride film is formed by depositing silicon in an oxidative atmosphere and in a nitriding atmosphere respectively.

The nonvolatile semiconductor memory device wherein said potential barrier film or said first potential barrier film is a silicon oxide film or another oxynitride film.

The nonvolatile semiconductor memory device wherein said silicon oxynitride film is 3 nm and over thickness.

The nonvolatile semiconductor memory device wherein said silicon oxynitride film is formed by nitriding a silicon oxide film of 3 nm and over in thickness.

The nonvolatile semiconductor memory device according to claim 13, wherein the concentration of nitrogen in said different silicon oxynitride film is lower than that in said silicon oxide film in (e).

A nonvolatile semiconductor memory device, comprising: (a) first and second semiconductor regions formed in a semiconductor substrate; (b) first and second gate electrodes formed on said semiconductor substrate between said first and second semiconductor regions;
(c) a first insulator film formed between said first gate electrode and said semiconductor substrate; and
(d) a second insulator film formed between said second gate electrode and said semiconductor substrate;
(e) wherein said second insulator film consists of a first potential barrier film formed on said semiconductor substrate, a silicon oxynitride film formed on said first potential barrier film, and a second potential barrier film formed on said silicon oxynitride film; and (f) wherein said silicon oxynitride film has a charge trapping function and electrons trapped in said silicon oxynitride film are erased due to holes injected from said semiconductor substrate side.

The nonvolatile semiconductor memory device wherein said electrons trapped in said oxynitride film are injected with a hot-electron injection method.

The nonvolatile semiconductor memory device wherein $z=0.314$ and over is satisfied when said silicon oxynitride film is assumed as $Si_xO_yN_z$ ($x+y+z=1$).

The nonvolatile semiconductor memory device according wherein $y=0.3$ and under is satisfied when said silicon oxynitride film is assumed as $Si_xO_yN_z$ ($x+y+z=1$).

The nonvolatile semiconductor memory device wherein said silicon oxynitride film is over 5 nm to 15 nm in thickness.

The nonvolatile semiconductor memory device wherein said silicon oxynitride film is over 7 nm to 13 nm in thickness.

The nonvolatile semiconductor memory device according wherein said silicon oxynitride film is a deposited film.

The nonvolatile semiconductor memory device wherein said silicon oxynitride film is formed with silicon compounds, oxygen compounds, and nitrogen compounds or silicon compounds and other compounds including oxygen and nitrogen with use of a chemical vapor deposition method.

The nonvolatile semiconductor memory device wherein said silicon oxynitride film is formed by depositing silicon in an oxidative atmosphere and in a nitriding atmosphere respectively.

The above description is not intended to limit the scope of the envisioned and disclosed invention and equivalents thereto and variations thereto are contemplated.

What is claimed is:

1. A nonvolatile semiconductor memory device, comprising:
   (a) first and second semiconductor regions formed in a semiconductor substrate;
   (b) first and second gate electrodes located near said semiconductor substrate between said first and second semiconductor regions;
   (c) a first insulator film formed between said first gate electrode and said semiconductor substrate; and
   (d) a second insulator film formed between said second gate electrode and said semiconductor substrate;
   (e) wherein said second insulator film comprises a potential barrier film formed on said semiconductor substrate and a charge trapping film formed on said potential barrier film; and wherein said charge trapping film comprises a silicon oxynitride film and a third insulator film in which the sum of the energy between a vacuum level and a conduction band of said third insulator film and a band gap of said third insulator film is smaller than that of said silicon oxynitride film; and
   wherein the product of a charge trap density and a film thickness of said silicon oxynitride film is larger than that of said third insulator film.

2. The nonvolatile semiconductor memory device according to claim 1,
   wherein said third insulator film is a silicon nitride film.

3. The nonvolatile semiconductor memory device according to claim 1,
   wherein said third insulator film is another silicon oxynitride film having an oxygen concentration lower than that of said silicon oxynitride film.

4. The nonvolatile semiconductor memory device according to claim 1,
   wherein said third insulator film is formed between said silicon oxynitride film and said potential barrier film.

5. The nonvolatile semiconductor memory device according to claim 1,
   wherein said third insulator film is formed on sad silicon oxynitride film.

6. The nonvolatile semiconductor memory device according to claim 1,
   wherein said charge trapping film includes a fourth insulator film in which the sum of the energy between the vacuum level and the conduction band of said fourth film and the band gap of said fourth film is smaller than that of said silicon oxynitride film; and
   wherein said silicon oxynitride film is formed between said third and fourth insulator films.

7. The nonvolatile semiconductor memory device according to claim 1,
   wherein said device further includes a fourth insulator film formed on said charge trapping film; and
   wherein, when said energy between said vacuum level and said conduction band is smaller in said silicon oxynitride film than in said fourth insulator film, said fourth insulator film is 1 nm and under in thickness.

8. The nonvolatile semiconductor memory device according to claim 1,
   wherein said silicon oxynitride film has a charge trapping function and electrons trapped in said silicon oxynitride film are ejected into said second gate electrode due to a potential applied to said second gate electrode.

9. The nonvolatile semiconductor memory device according to claim 1,
   wherein the condition $z=0.314$ or greater is satisfied when said silicon oxynitride film is composed as $Si_xO_yN_z$ where ($x+y+z=1$).

10. The nonvolatile semiconductor memory device according to claim 1,
    wherein the condition $y=0.3$ or less is satisfied when said silicon oxynitride film is assumed as $Si_xO_yN_z$ where ($x+y+z=1$).

11. The nonvolatile semiconductor memory device according to claim 1,
    wherein said silicon oxynitride film is over 10 nm to 30 nm in thickness.

12. The nonvolatile semiconductor memory device according to claim 11,
    wherein said silicon oxynitride film is over 12 nm to 20 nm in thickness.

13. The nonvolatile semiconductor memory device according to claim 1,
    wherein said silicon oxynitride film is a deposited film.

14. The nonvolatile semiconductor memory device according to claim 1, wherein said silicon oxynitride film is formed with silicon compounds, oxygen compounds, and nitrogen compounds or silicon compounds and other compounds including oxygen and nitrogen with use of a chemical vapor deposition method.

15. The nonvolatile semiconductor memory device according to claim 1, wherein said silicon oxynitride film is formed by depositing silicon in an oxidative atmosphere and in a nitriding atmosphere respectively.

16. A nonvolatile semiconductor memory device, comprising:

(a) first and second semiconductor regions formed in a semiconductor substrate;

(b) first and second gate electrodes located by said semiconductor substrate between said first and second semiconductor regions;

(c) a first insulator film formed between said first gate electrode and said semiconductor substrate; and (d) a second insulator film formed between said second gate electrode and said semiconductor substrate;

(e) wherein said second insulator film comprises a potential barrier film located on said semiconductor substrate and a silicon oxynitride film located on the potential barrier film wherein said second gate electrode is positioned on said silicon oxynitride film.

17. The nonvolatile semiconductor memory device according to claim 16, wherein said silicon oxynitride film has a charge trapping function and electrons trapped in said silicon oxynitride film are ejected into said second gate electrode due to a potential applied to said second gate electrode.

18. A nonvolatile semiconductor memory device, comprising:

(a) first and second semiconductor regions formed in a semiconductor substrate;

(b) first and second gate electrodes located by said semiconductor substrate between said first and second semiconductor regions;

(c) a first insulator film formed between said first gate electrode and said semiconductor substrate; and (d) a second insulator film formed between said second gate electrode and said semiconductor substrate;

(e) wherein said second insulator film comprises a first potential barrier film formed on said semiconductor substrate, a silicon oxynitride film formed on said first potential barrier film, and a second potential barrier film formed on said silicon oxynitride film wherein said second potential barrier film is 1 nm or less in thickness.

19. The nonvolatile semiconductor memory device according to claim 18, wherein said second potential barrier film is 0.5 nm or less in thickness.

20. The nonvolatile semiconductor memory device according to claim 18, wherein said silicon oxynitride film has a charge trapping function and electrons trapped in said silicon oxynitride film are ejected into said second gate electrode due to a potential applied to said second gate electrode.

* * * * *